United States Patent [19]
Tago

[11] Patent Number: 5,389,828
[45] Date of Patent: Feb. 14, 1995

[54] PROGRAMMABLE DELAY GENERATOR FOR INDEPENDENTLY CONTROLLING LEADING AND TRAILING EDGES OF DELAYED PULSE

[75] Inventor: Shusei Tago, Tokyo, Japan
[73] Assignee: NEC Corporation, Tokyo, Japan
[21] Appl. No.: 936,520
[22] Filed: Aug. 28, 1992
[30] Foreign Application Priority Data
Aug. 29, 1991 [JP] Japan .................................. 3-244406
[51] Int. Cl.⁶ ...................... H03K 5/12; H03K 5/159
[52] U.S. Cl. .................................. 327/263; 327/276; 327/170
[58] Field of Search ...................... 307/263, 592, 601
[56] References Cited
U.S. PATENT DOCUMENTS
4,645,958  2/1987  Suzuki et al. ................. 307/592 X
5,028,824  7/1991  Young ........................... 307/263 X
5,041,747  8/1991  Chengson et al. ............. 307/601 X
5,059,837  10/1991  Erdelyi et al. ..................... 307/601
5,128,555  7/1992  Millman .......................... 307/592 X Primary Examiner—Willis R. Wolfe
Attorney, Agent, or Firm—Sughrue, Mion, Zinn, Macpeak & Seas

[57] ABSTRACT

A programmable delay generator produces a composite delayed pulse from an input pulse, and the leading edge of the composite delayed pulse is controlled by a voltage comparator with a variable reference voltage level supplied from a digital-to-analog converter; however, an OR gate determines the trailing edge of the composite delayed pulse with a delayed input pulse supplied from a delay circuit so that the trailing edge is independently controllable regardless of the time delay introduced by the voltage comparator.

13 Claims, 7 Drawing Sheets

PROGRAMMABLE DELAY GENERATOR FOR INDEPENDENTLY CONTROLLING LEADING AND TRAILING EDGES OF DELAYED PULSE

FIELD OF THE INVENTION

This invention relates to a programmable delay generator and, more particularly, to a programmable delay generator for independently controlling the leading and trailing edges of a delayed pulse.

DESCRIPTION OF THE RELATED ART

A typical example of the programmable delay generator is illustrated in FIG. 1, and comprises a digital-to-analog converter 1 and a voltage comparator 2 implemented by a differential amplifier. An (n+1) bit digital control signal S0 to Sn is supplied to the digital-to-analog converter 1, and the digital-to-analog converter 1 produces a reference voltage signal Vref corresponding to the value indicated by the (n+1) bit digital control signal S0 to Sn. The reference voltage signal Vref is supplied to an inverted input node of the voltage comparator 2, and an input terminal 3 supplies an input pulse IN to a non-inverted input node of the voltage comparator 2. In this instance, the input pulse IN rises from zero volt to 5 volts, and, accordingly, the digital-to-analog converter 1 regulates the reference voltage signal Vref to any arbitrary level between zero and 5 volts corresponding to the (n+1) bit digital control signal S0 to Sn.

While the voltage level of the input pulse IN is lower than the reference voltage signal Vref, the output node of the voltage comparator 2 remains in low voltage level L. However, when the voltage level of the input pulse IN exceeds the reference voltage signal Vref, the output node of the voltage comparator 2 is elevated to high voltage level H. For example, if the (n+1) bit control signal S0 to Sn is indicative of the reference voltage level Vref1, the voltage comparator 2 allows the delayed pulse OUT to rise at time t2, and decays it at time t3 as shown in FIG. 2. However, if the (n+1) bit digital control signal S0 to Sn is decreased to value corresponding to the reference voltage level Vref2, the voltage comparator 2 elevates the delayed pulse OUT at time t1, and delays it at time t4. Then, the leading edge of the delayed pulse OUT is controllable with the (n+1) bit digital control signal S0 to Sn. Thus, the prior art programmable delay generator shrinks and expands the pulse width of the delayed pulse OUT depending upon the value of the (n+1) bit digital control signal S0 to Sn. However, the prior art programmable delay generator changes the trailing edge of the delayed pulse OUT together with the leading edge thereof, and it is impossible to change either leading or trailing edge with respect to those of the lamp pulse IN.

SUMMARY OF THE INVENTION

It is therefore an important object of the present invention to provide a programmable delay generator which independently controls the leading and trailing edges of a delay pulse.

To accomplish the object, the present invention proposes to compose a delayed pulse signal and a delayed input pulse for independently controlling leading and trailing edges of a composite delayed pulse.

In accordance with one aspect of the present invention, there is provided a programmable delay generator comprising: a) a reference voltage producing means responsive to a digital control signal, and producing a reference voltage level corresponding to value indicated by the digital control signal; b) a voltage comparing means coupled with the reference voltage producing means and with an input pulse generator, and operative to compare the voltage level of an input pulse with the reference voltage level for producing a delayed pulse shrunk with respect to the input pulse; c) a delay means coupled with the input pulse generator, and operative to introduce time delay into the input pulse for producing delayed input pulse, the time delay introduced by the delay means being larger than time delay introduced by the voltage comparing means; and d) a composer coupled with the delay means and with the voltage comparing means, and operative to produce a composite delayed pulse from the delayed pulse and the delayed input pulse for independently controlling leading and trailing edges of the composite delayed pulse with respect to the input pulse.

In accordance with another aspect of the present invention, there is provided a programmable delay generator comprising: a) a reference voltage producing means responsive to a digital control signal for producing a reference signal; b) a first delay generating unit supplied with an input pulse, and responsive to the reference signal for introducing time delay between a leading edge of the input pulse and a leading edge of a composite delayed pulse; and c) a second delay generating unit supplied with an output pulse of the first delay generating unit, and responsive to the reference signal for introducing time delay between a trailing edge of the input pulse and a trailing edge of the composite delayed pulse so as to independently control timings for the leading edge and the trailing edge of the composite delayed pulse.

BRIEF DESCRIPTION OF THE DRAWINGS

The features and advantages of the programmable delay generator according to the present invention will be more clearly understood from the following description taken in conjunction with the accompanying drawings in which.

DESCRIPTION OF THE PREFERRED EMBODIMENTS

First Embodiment

Figure 1:
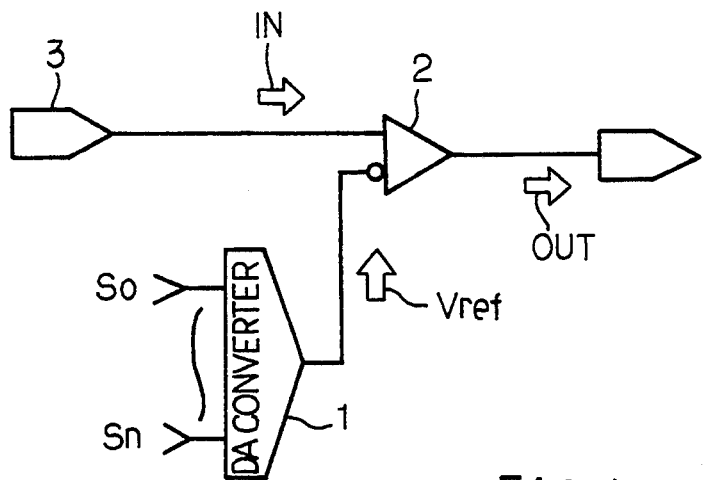
FIG. 1 is a circuit diagram showing the arrangement of the prior art programmable delay generator.
Figure 2:
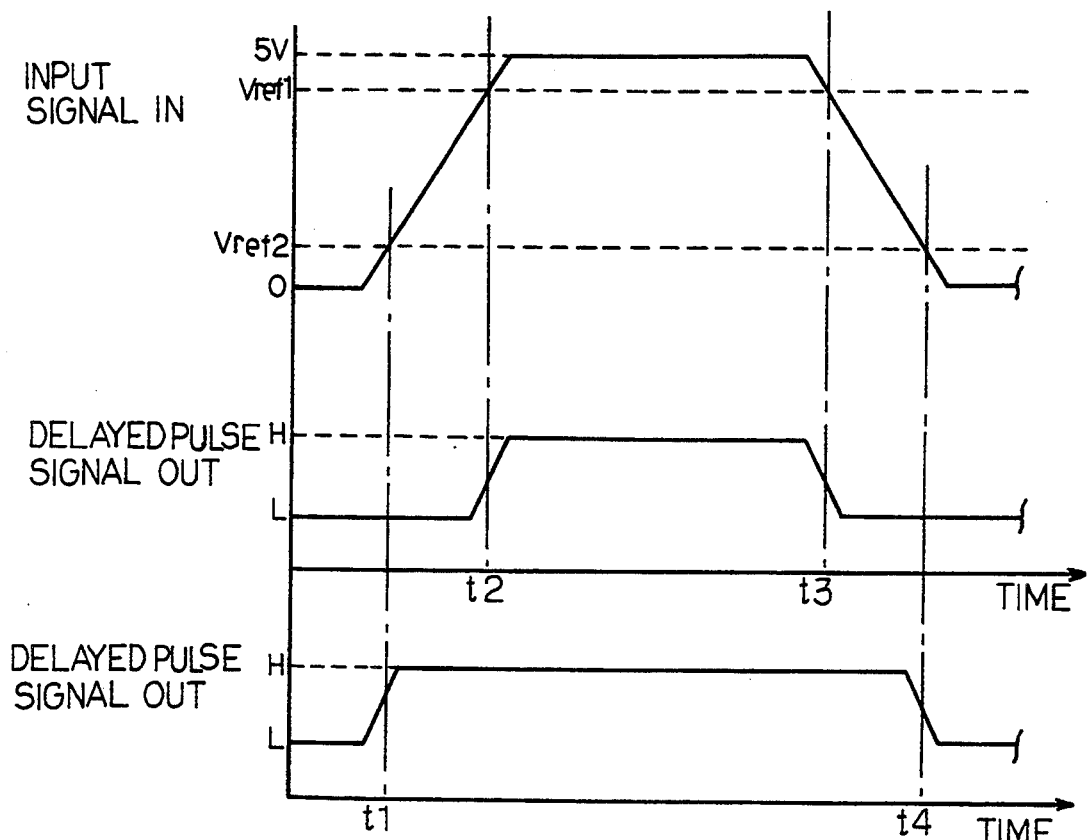
FIG. 2 is a graph showing the waveform of the input pulse and the waveforms of the delayed pulses produced by the prior art programmable delay generator.
Figure 3:
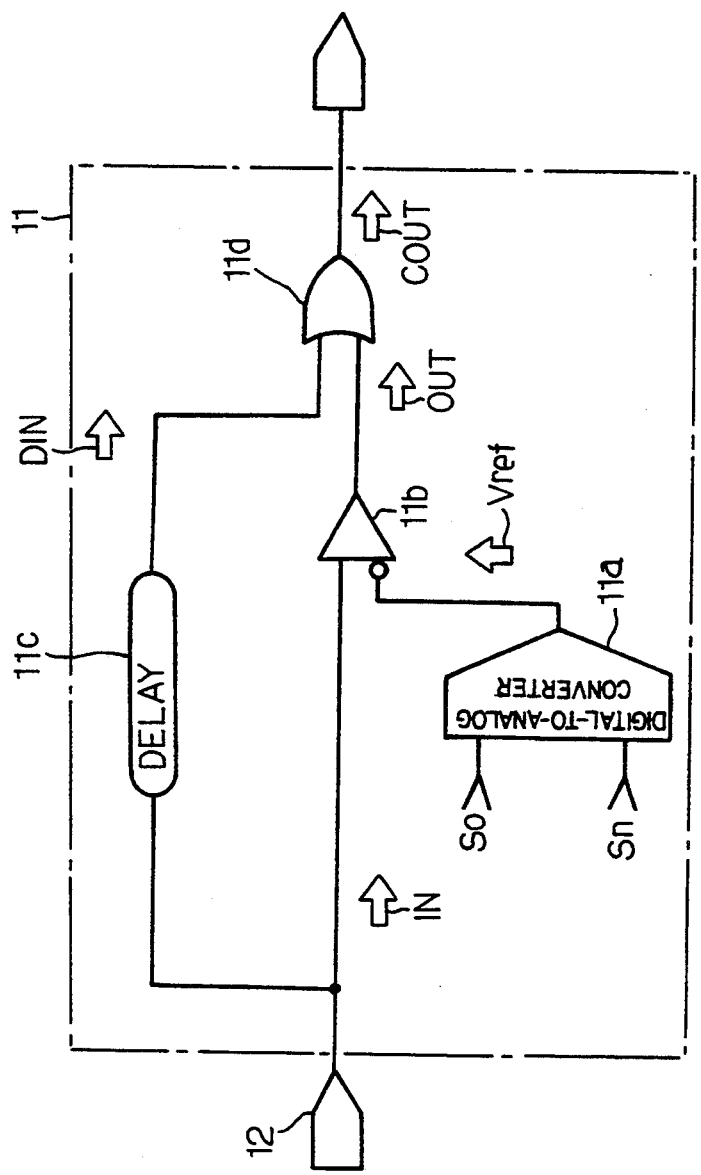
FIG. 3 is a circuit diagram showing the arrangement of a programmable delay generator according to the present invention.

Referring to FIG. 3 of the drawings, a programmable delay generator 11 embodying the present invention comprises a digital-to-analog converter 11a, a voltage comparator 11b, a delay circuit 11c and an OR gate 11d. In this instance, the delay circuit 11c is implemented by an integrator or a delay line, and the digital-to-analog converter 11a can adjust the reference voltage level Vref to an arbitrary point in voltage range as high as the pulse height of an input pulse IN. An (n+1) bit digital control signal S0 to Sn is supplied to the digital-to-analog converter 11a, and the digital-to-analog converter 11a produces a reference voltage signal Vref corresponding to the value of the (n+1) bit digital control signal S0 to Sn. The reference voltage signal Vref is supplied to an inverted input node of the voltage comparator 11b. An input pulse generator 12 produces the input pulse IN, and the input pulse IN is distributed to a non-inverted input node of the voltage comparator 11b as well as the delay circuit 11c. The voltage comparator 11b allows a delayed pulse OUT to remain in low voltage level while the input pulse IN is lower than the reference voltage signal Vref. However, when the input pulse IN exceeds the reference voltage level Vref, the voltage comparator 11b elevates the delayed pulse OUT to high voltage level. Therefore, the delayed pulse OUT is shrunk with respect to the input pulse IN, and the leading and trailing edges of the input pulse IN are dependently controlled with the reference voltage signal Vref.

The delay circuit 11c introduces time delay into the input pulse IN, and produces a delayed input pulse DIN. Since the delay circuit 11c merely retards the input pulse IN, the delayed input pulse DIN is never shrunk with respect to the input pulse IN, and is, accordingly, equal in pulse width to the input pulse IN. The delayed pulse OUT as well as the delayed input pulse DIN reaches the OR gate 11d at different timings, and the OR gate 11d composes the delayed pulse OUT and the delayed input pulse DIN for producing a composite delayed pulse COUT.

Figure 4:
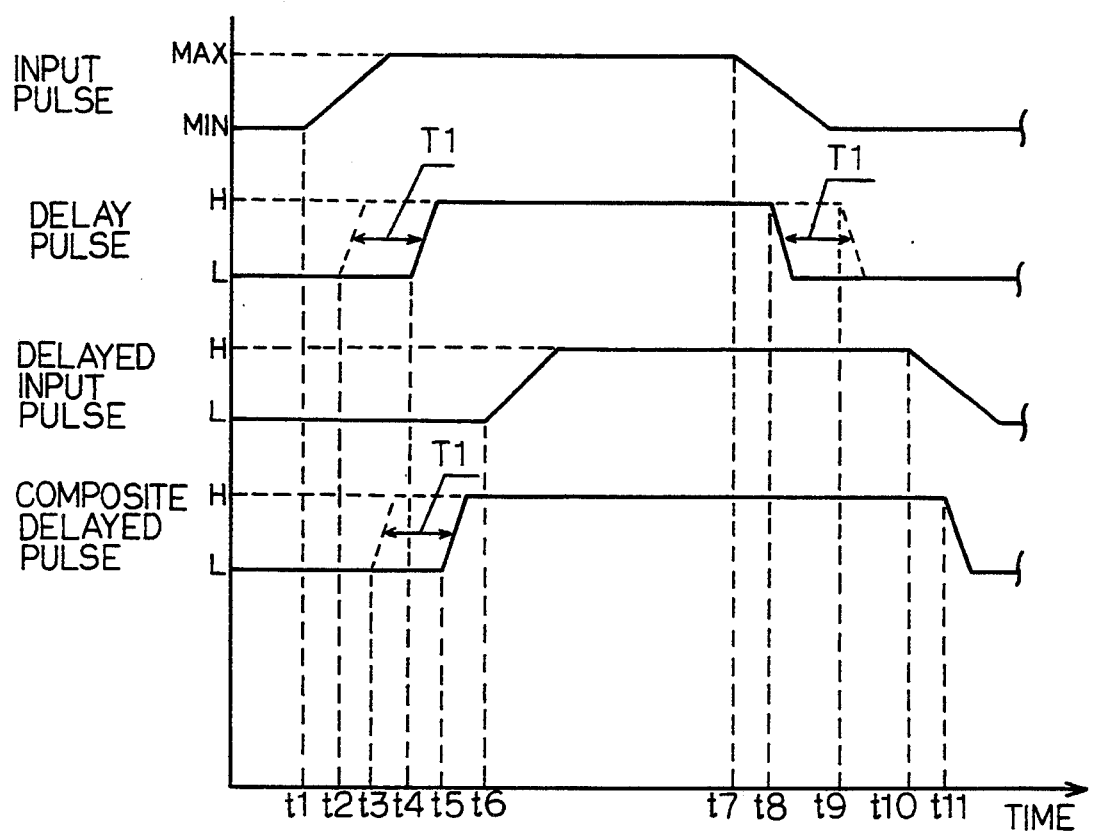
FIG. 4 is a graph showing the waveform of an input pulse, the waveform of a delayed input pulse, the waveform of a delayed pulse and the waveform of a composite delayed pulse for the programmable delay generator shown in FIG. 3.

Description is made on circuit behavior of the programmable delay generator implementing the first embodiment with reference to FIG. 4. Assuming now that the input pulse IN starts rising at time t1, the voltage comparator 11b introduces time lag, and the delayed pulse OUT starts rising at time t2 under the reference voltage signal Vref adjusted to the minimum level MIN or at time t4 under the reference voltage signal Vref adjusted to the maximum level MAX. Therefore, variable time delay T1 is introduced with the reference voltage signal Vref. On the other hand, the delay circuit 11c allows the delayed input pulse DIN to start rising at time t6, and the delayed pulse OUT and the delayed input pulse DIN are supplied to the OR gate 11d. The OR gate introduces time lag, and allows the composite delayed pulse COUT to start rising at time t3 under the reference voltage level Vref adjusted to the minimum level MIN or at time t5 under the reference voltage level Vref adjusted to the maximum level MAX, because the delayed input pulse DIN starts rising after time t5. Thus, the leading edge of the composite delayed pulse COUT is variable within the time range equal to the time period T1.

If the input pulse IN starts decaying at time t7, the voltage comparator 11b introduces the time lag again, and the delayed pulse OUT starts decaying at time t8 under the reference voltage signal Vref adjusted to the maximum level MAX or at time t9 under the reference voltage signal Vref adjusted to the minimum level MIN. Thus, the variable time delay T1 is also introduced by the voltage comparator 11b; however, the variable time delay T1 for the trailing edge never affects the composite delayed pulse COUT as described hereinbelow. The delayed input pulse DIN starts decaying at time t10, and the delayed pulse OUT is ORed with the delayed input pulse DIN. Since the delayed input pulse starts decaying after time t9, the OR gate 11d allows the composite delayed pulse COUT to start decaying at time t11 after the time lag in synchronism with the delayed input pulse DIN. For this reason, the trailing edge of the composite delayed pulse COUT is determined by the trailing edge of the delayed input pulse DIN, and is independent from the leading edge thereof.

Thus, the programmable delay generator shown in FIG. 4 controls the leading edge of the composite delayed pulse COUT with the reference voltage signal Vref and the trailing edge of the composite delayed pulse COUT with time delay introduced by the delay circuit 11c, and the reference voltage level Vref and the time delay are variable by changing the (n+1) bit digital control signal S0 to Sn and the adjustable parameters of the delay circuit 11c.

Second Embodiment

Figure 5:
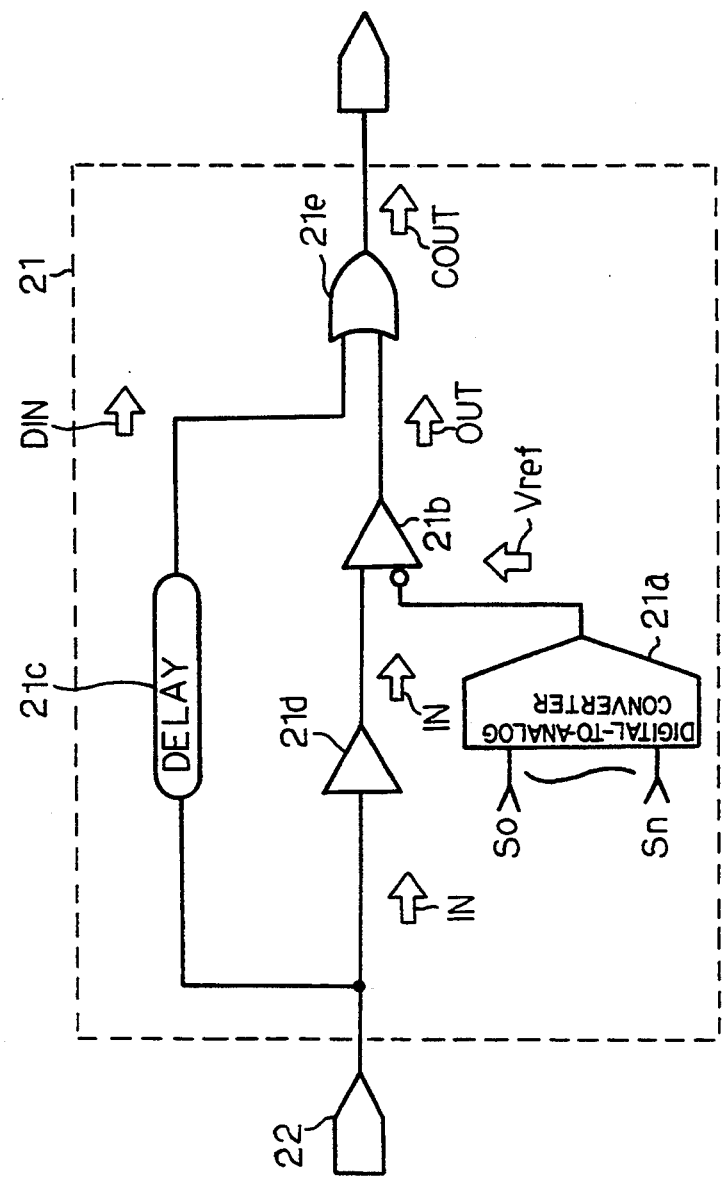
FIG. 5 is a diagram showing the arrangement of another programmable delayed generator according to the present invention.

Turning to FIG. 5 of the drawings, another programmable delay generator 21 embodying the present invention comprises a digital-to-analog converter 21a, a voltage comparator 21b, a delay circuit 21c, a buffer circuit 21d and an OR gate 21e. The buffer circuit 21d is newly added to the programmable delay generator 21. However, the other component circuits 21a to 21c and 21e are similar to those 11a to 11d of the first embodiment, and no further description is incorporated hereinbelow for the sake of simplicity. An input pulse generator is labeled with reference numeral 22.

The programmable delay generator 21 can achieve exact control for the leading edge of the composite delayed pulse COUT. In detail, if the input pulse IN is deformed and, accordingly, the pulse rise time is changed from the design value, the crossing point at the reference voltage level Vref is also varied depending upon the variation of the pulse rise time. However, the buffer circuit 21d keeps the pulse rise time or the angle of the leading edge of the input pulse IN constant, and the delay time is exactly introduced into the composite delayed pulse COUT. However, the other circuit behavior is analogous, and no further description is incorporated hereinbelow.

Third Embodiment

Figure 6:
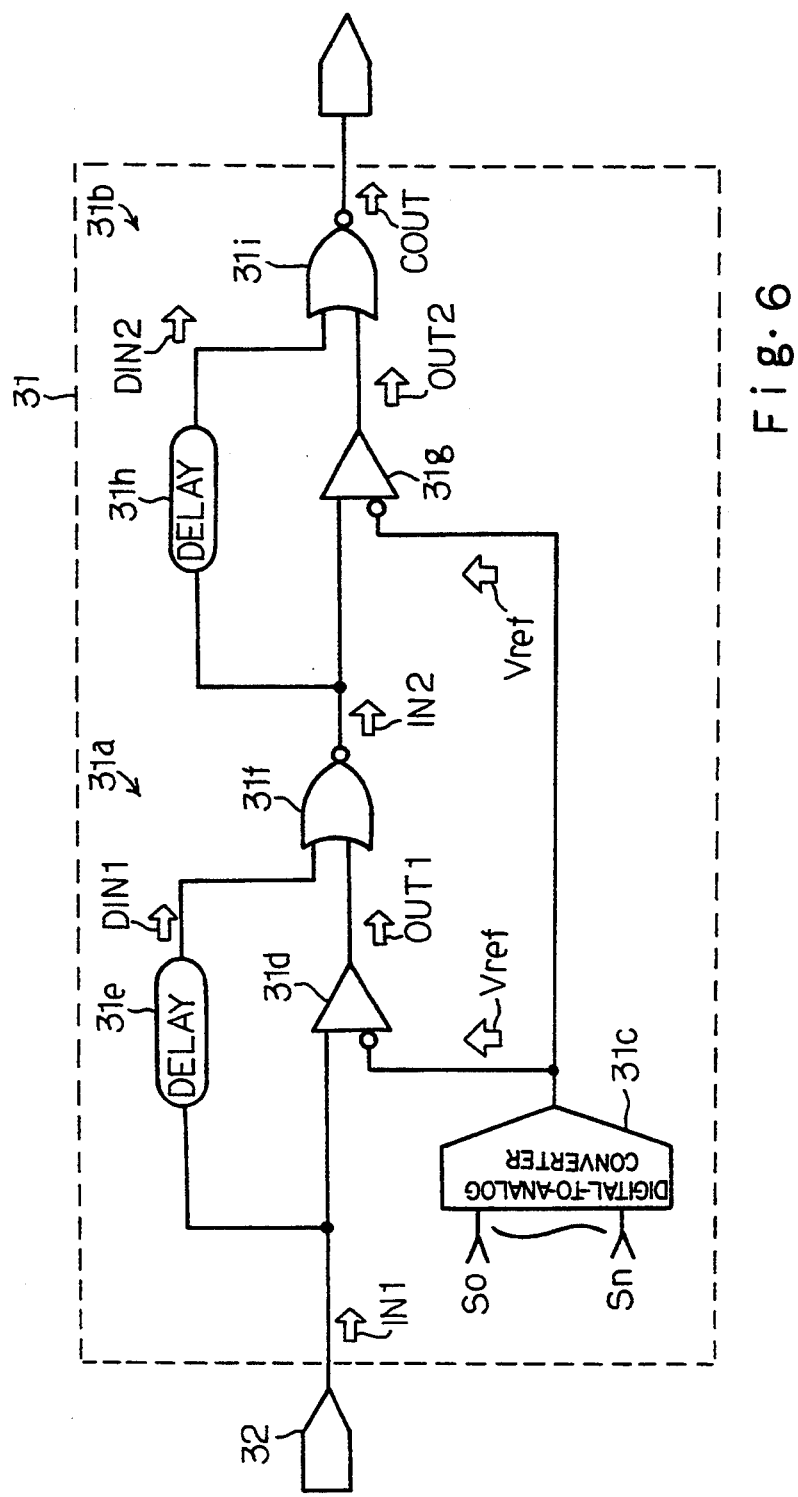
FIG. 6 is a circuit diagram showing the arrangement of yet another programmable delay generator according to the present invention.

Turing to FIG. 6 of the drawings, yet another programmable delay generator 31 largely comprises a first delay generating unit 31a and a second delay generating unit 31b, and a digital-to-analog converter 31c is shared between the first and second delay generating units 31a and 31b. The first delay generating unit 31a comprises a voltage comparator 31d, a delay circuit 31e and a NOR gate 31f, and the second delay generating unit 31b also comprises a voltage comparator 31g, a delay circuit 31h and a NOR gate 31i. A digital control signal S0 to Sn is supplied to the digital-to-analog converter 31c, and the digital-to-analog converter 31c produces a reference voltage signal Vref corresponding to the value of the digital control signal S0 to Sn. The reference voltage signal Vref is supplied to inverted nodes of the voltage comparators 31d and 31g. A primary input pulse IN1 is supplied from an input pulse generator 32 to the delay circuit 31e and to a non-inverted node of the voltage comparator 31d. The voltage comparator 31d produces a primary delayed pulse OUT1, and the delayed pulse OUT1 is NORed with a primary delayed input pulse DIN1 from the delay circuit 31e. The NOR gate 31f supplies a secondary input pulse IN2 to the delay circuit 31h and the voltage comparator 31g, and the voltage comparator 31g produces a secondary delayed pulse OUT2. The secondary delayed pulse OUT2 is NORed with a secondary delayed input pulse DIN2, and the NOR gate 31i produces a composite delayed pulse COUT. The first delay generating unit 31a controls the leading edge of the composite delayed pulse COUT, and the second delay generating unit 31b controls the trailing edge of the composite delayed pulse COUT as will be described in detail hereinbelow.

Figure 7:
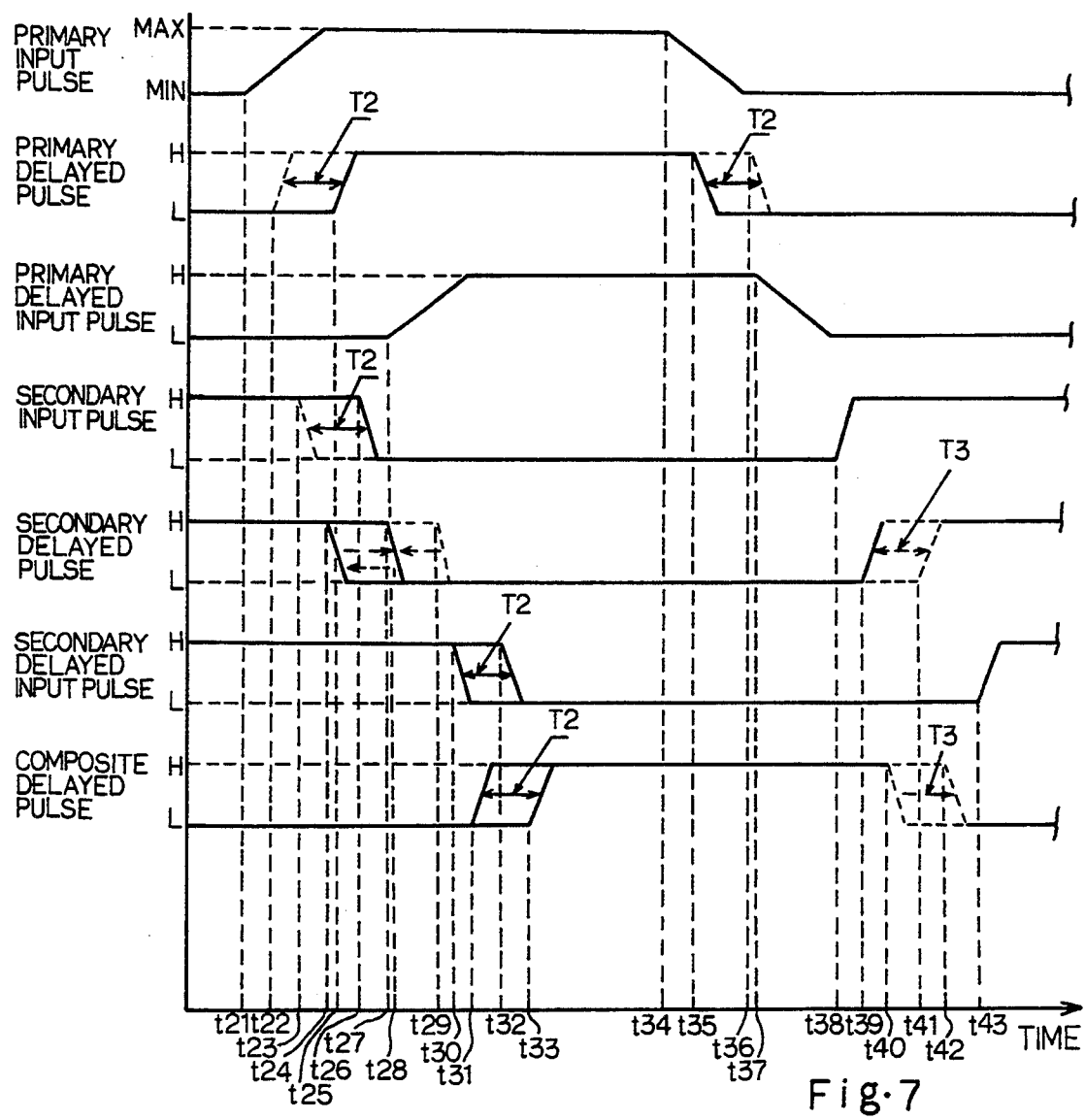
FIG. 7 is a graph showing the circuit behavior of the yet another programmable delay generator.

FIG. 7 illustrates circuit behavior of the programmable delay generator implementing the second embodiment. Assuming now that the primary input pulse IN1 starts rising at time t21, the voltage comparator 31d introduces time lag, and the delayed pulse OUT1 starts rising at time t22 under the reference voltage signal Vref adjusted to the minimum level MIN or at time t25 under the reference voltage signal Vref adjusted to the maximum level MAX. Therefore, variable time delay T2 is introduced with the reference voltage signal Vref. On the other hand, the delay circuit 31e allows the primary delayed input pulse DIN1 to start rising at time t27, and the primary delayed pulse OUT1 and the primary delayed input pulse DIN1 are supplied to the NOR gate 31f. The NOR gate 31f per se introduces time lag, and allows the secondary input pulse IN2 to start decaying at time t23 under the reference voltage level Vref adjusted to the minimum level MIN or at time t26 under the reference voltage level Vref adjusted to the maximum level MAX, because the primary delayed input pulse DIN1 starts rising after time t25. Thus, the leading edge of the secondary input pulse IN2 is variable within the time range equal to T2.

The secondary input pulse IN2 is compared with the reference voltage level Vref, and the voltage comparator 31g allows the secondary delayed pulse OUT2 to start decaying between time t24 and time t29. However, the secondary delayed input pulse DIN2 starts decaying between time t30 and time t32. Thus, the secondary delayed input pulse DIN2 remains in the high voltage level, and the NOR gate 31i is not responsive to the transition of the secondary delayed pulse OUT2 between time t24 and time t29. However, the time delay T2 is relayed to the secondary delayed input pulse DIN2, and the NOR gate 31i allows the composite delayed pulse COUT to start rising between time t31 and time t33. As a result, the time delay T2 introduced by the first delay generating unit 31a determines timing of rising for the leading edge of the composite delayed pulse COUT.

If the primary input pulse IN1 starts decaying at time t34, the voltage comparator 31d introduces the time lag again, and the primary delayed pulse OUT1 starts decaying at time t35 under the reference voltage signal Vref adjusted to the maximum level MAX or at time t36 under the reference voltage signal Vref adjusted to the minimum level MIN. The NOR gate 31f is enabled with the primary delayed pulse OUT1 of the low voltage level; however, the primary delayed input pulse DIN1 of the high voltage level allows the secondary input pulse IN2 to remain in the low voltage level. The primary delayed input pulse DIN1 starts decaying at time t37, and is NORed with the delayed pulse OUT1. Then, the secondary input pulse IN2 starts rising at time t38, and is compared with the reference voltage level Vref by the voltage comparator 31g. The voltage comparator 31g introduces time lag inherent therein, and retards the leading edge of the secondary delayed pulse OUT2 between time t39 and time t41. As a result, time delay T3 is introduced in the secondary delayed pulse OUT2. The delay circuit 31h also retards the secondary input pulse IN2 for producing the secondary delayed input pulse DIN2, and the secondary delayed input pulse DIN2 starts rising at time t43. While the secondary delayed input pulse DIN2 remains in the low voltage level, the NOR gate 31i is enabled, and the NOR gate 31i allows the composite delayed pulse COUT to start decaying between time t40 and time t42 after time lag in synchronism with the secondary delayed pulse OUT2. Then, the time delay T3 is introduced in the composite delayed pulse COUT, and the trailing edge of the composite delayed pulse COUT is controlled by the second delay generating unit 31b.

Thus, the programmable delay generator shown in FIG. 6 controls the leading edge of the composite delayed pulse COUT by the first delay generating unit 31a and the trailing edge of the composite delayed pulse COUT by the second delay generating unit 31b. As a result, the timings for the leading and trailing edges of the composite delayed pulse COUT are controllable with the digital control signal S0 to Sn as well as the adjustable parameters of the delay circuit 31e.

Fourth Embodiment

Figure 8:
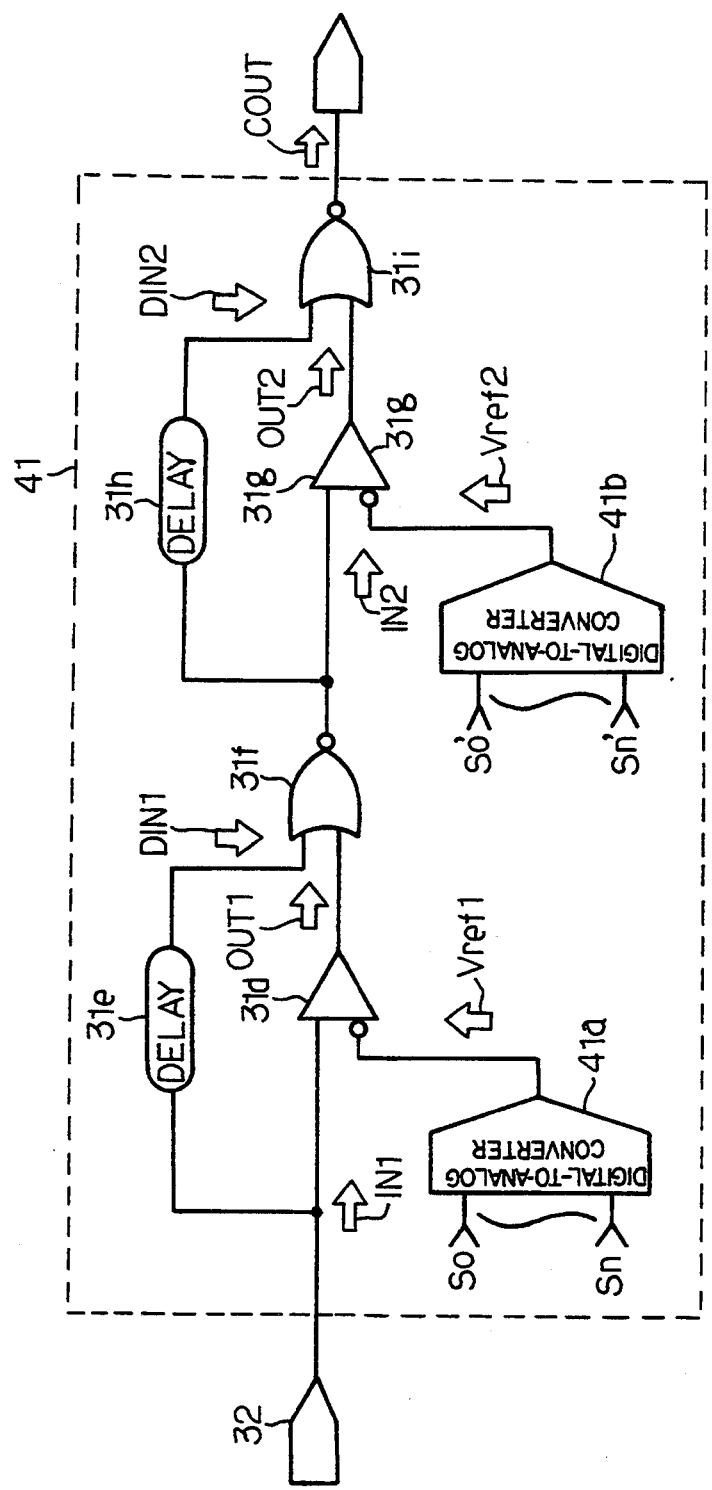
FIG. 8 is a circuit diagram showing the arrangement of still another programmable delay generator according to the present invention.

Turning to FIG. 8 of the drawings, still another programmable delay generator 41 embodying the present invention is illustrated. The arrangement of the programmable delay generator 41 is similar to that of the programmable delay generator 31 except for a dual reference voltage producing system. For this reason, the other components of the programmable delay generator 41 are labeled with the same references designating the corresponding components of the third embodiment.

In the programmable delay generator 41, two digital-to-analog converters 41a and 41b are provided for the voltage comparators 31d and 31g, respectively, and the digital control signal is constituted by a first bit string S0 to Sn and a second bit string S0' to Sn'. The digital-to-analog converter 41a is responsive to the first bit string S0 to Sn, and produces a first reference voltage Vref1 for the voltage comparator 31d. On the other hand, the digital-to-analog converter 41b is responsive to the second bit string S0' to Sn' and produces a second reference voltage Vref2 for the voltage comparator 31i. The first and second bit strings S0 to Sn and S0' to Sn' are independently variable, and the time delays T2 and T3 are also independently controllable.

As will be understood from the foregoing description, the programmable delay generator according to the present invention can independently control the timings for the leading edge and the trailing edge of the composite delayed pulse.

Although particular embodiments of the present invention have been shown and described, it will be obvious to those skilled in the art that various changes and modifications may be made without departing from the spirit and scope of the present invention.

What is claimed is:

1. A programmable delay generator comprising:
   a) a reference voltage producing means responsive to a digital control signal, and producing a reference voltage level corresponding to value indicated by said digital control signal;
   b) a voltage comparing means coupled with said reference voltage producing means and with an input pulse generator, and operative to compare the voltage level of an input pulse with said reference voltage level for producing a delayed pulse shrunk with respect to said input pulse;
   c) a delay means coupled with said input pulse generator, and operative to introduce time delay into said input pulse for producing delayed input pulse, said time delay introduced by said delay means being larger than time delay introduced by said voltage comparing means; and
   d) a composer coupled with said delay means and with said voltage comparing means, and operative to produce a composite delayed pulse from said delayed pulse and said delayed input pulse for independently controlling leading and trailing edges of said composite delayed pulse with respect to said input pulse.

2. A programmable delay generator as set forth in claim 1, in which said reference voltage producing means is implemented by a digital-to-analog converter.

3. A programmable delay generator as set forth in claim 1, in which said voltage comparing means is implemented by a voltage comparator directly supplied with said input pulse.

4. A programmable delay generator comprising:
   a) a reference voltage producing means responsive to a digital control signal, and producing a reference voltage level corresponding to value indicated by said digital control signal;
   b) a voltage comparing means coupled with said reference voltage producing means and with an input pulse generator, and operative to compare the voltage level of an input pulse with said reference voltage level for producing a delayed pulse shrunk with respect to said input pulse
   c) a delay means implemented by one of an integrator and a delay line, and coupled with said input pulse generator, said delay means being operative to introduce time delay into said input pulse for producing delayed input pulse, said time delay introduced by said delay means being larger than time delay introduced by said voltage comparing means; and
   d) a composer coupled with said delay means and with said voltage comparing means, and operative to produce a composite delayed pulse from said delayed pulse and said delayed input pulse for independently controlling leading and trailing edges of said composite delayed pulse with respect to said input pulse.

5. A programmable delay generator comprising:
   a) a reference voltage producing means responsive to a digital control signal, and producing a reference voltage level corresponding to value indicated by said digital control signal;
   b) a voltage comparing means coupled with said reference voltage producing means and with an input pulse generator, and operative to compare the voltage level of an input pulse with said reference voltage level for producing a delayed pulse shrunk with respect to said input pulse;
   c) a delay means coupled with said input pulse generator, and operative to introduce time delay into said input pulse for producing delayed input pulse, said time delay introduced by said delay means being larger than time delay introduced by said voltage comparing means; and
   d) a composer implemented by an OR gate, and coupled with said delay means and with said voltage comparing means, said composer being operative to produce a composite delayed pulse from said delayed pulse and said delayed input pulse for independently controlling leading and trailing edges of said composite delayed pulse with respect to said input pulse.

6. A programmable delay generator comprising:
   a) a reference voltage producing means responsive to a digital control signal, and producing a reference voltage level corresponding to value indicated by said digital control signal;
   b) a voltage comparing means coupled with said reference voltage producing means and with an input pulse generator, and operative to compare the voltage level of an input pulse with said reference voltage level for producing a delayed pulse shrunk with respect to said input pulse, said voltage comparing means comprising b-1) a buffer circuit supplied with said input pulse, and operative to keep the pulse rise time of said input pulse substantially constant, and b-2) a voltage comparator having two input node supplied with said reference voltage level and with said input pulse from said buffer circuit;
   c) a delay means coupled with said input pulse generator, and operative to introduce time delay into said input pulse for producing delayed input pulse, said time delay introduced by said delay means being larger than time delay introduced by said voltage comparing means; and
   d) a composer coupled with said delay means and with said voltage comparing means, and operative to produce a composite delayed pulse from said delayed pulse and said delayed input pulse for independently controlling leading and trailing edges of said composite delayed pulse with respect to said input pulse.

7. A programmable delay generator comprising:
   a) a reference voltage producing means responsive to a digital control signal for producing a reference signal;
   b) a first delay generating unit supplied with an input pulse, and responsive to said reference signal for introducing time delay between a leading edge of said input pulse and a leading edge of a composite delayed pulse; and
   c) a second delay generating unit supplied with an output pulse of said first delay generating unit, and responsive to said reference signal for introducing time delay between a trailing edge of said input pulse and a trailing edge of said composite delayed pulse so as to independently control timings for the leading edge and the trailing edge of said composite delayed pulse.

8. A programmable delay generator as set forth in claim 7, in which said reference voltage producing means is implemented by a digital-to-analog converter for producing a reference voltage level serving as said reference signal.

9. A programmable delay generator as set forth in claim 8, in which said first delay generating unit comprises b-1) a first voltage comparator operative to compare said input pulse with said reference voltage level for producing a primary delayed pulse, b-2) a first delay circuit operative to introduce first time delay into said input pulse for producing a primary delayed input pulse, and b-3) a first NOR gate supplied with said primary delayed pulse and with said primary delayed input pulse for producing a secondary input pulse serving as said output pulse of said first delay generating unit.

10. A programmable delay generator as set forth in claim 9, in which said second delay generating unit comprises c-1) a second voltage comparator operative to compare said secondary input pulse with said reference voltage level for producing a secondary delayed pulse, c-2) a second delay circuit operative to introduce second time delay into said secondary input pulse for producing a secondary delayed input pulse, and c-3) a second NOR gate supplied with said secondary delayed pulse and with said secondary delayed input pulse for producing said composite delayed pulse.

11. A programmable delay generator as set forth in claim 7, in which said reference voltage producing means comprises a first digital-to-analog converter for producing a first reference voltage level from a first bit string of said digital control signal, and a second digital-to-analog converter for producing a second reference voltage level from a second bit string of said digital control signal.

12. A programmable delay generator as set forth in claim 11, in which said first delay generating unit comprises b-1) a first voltage comparator operative to compare said input pulse with said first reference voltage level for producing a primary delayed pulse, b-2) a first delay circuit operative to introduce first time delay into said input pulse for producing a primary delayed input pulse, and b-3) a first NOR gate supplied with said primary delayed pulse and with said primary delayed input pulse for producing a secondary input pulse serving as said output pulse of said first delay generating unit.

13. A programmable delay generator as set forth in claim 12, in which said second delay generating unit comprises c-1) a second voltage comparator operative to compare said secondary input pulse with said second reference voltage level for producing a secondary delayed pulse, c-2) a second delay circuit operative to introduce second time delay into said secondary input pulse for producing a secondary delayed input pulse, and c-3) a second NOR gate supplied with said secondary delayed pulse and with said secondary delayed input pulse for producing said composite delayed pulse.

* * * * *